(12) United States Patent
Eady et al.

(10) Patent No.: US 6,532,154 B2
(45) Date of Patent: Mar. 11, 2003

(54) STACK ASSEMBLY HOUSING

(75) Inventors: Mark Wilson Eady, Dundas (CA); John Charles Teeple, Kitchener (CA)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 09/756,684

(22) Filed: Jan. 9, 2001

(65) Prior Publication Data

US 2002/0089056 A1 Jul. 11, 2002

(51) Int. Cl.[7] ................................................ H05K 7/20
(52) U.S. Cl. ........................ 361/719; 257/727; 361/716; 363/141
(58) Field of Search ................................. 257/718, 719, 257/726, 727, 723, 724; 165/80.3, 185; 248/505, 510; 363/141, 144; 361/704, 707, 709–711, 715, 716, 717–719, 720, 721

(56) References Cited

U.S. PATENT DOCUMENTS

| | | | |
|---|---|---|---|
| 3,523,215 A | * | 8/1970 | Steinmetz et al. |
| 3,812,557 A | | 5/1974 | Meyer |
| 3,943,426 A | | 3/1976 | Thiele et al. |
| 4,029,141 A | | 6/1977 | Ferrari et al. |
| 4,224,623 A | | 9/1980 | Maiese et al. |
| 4,975,825 A | * | 12/1990 | Huss et al. ................... 363/141 |
| 5,162,974 A | * | 11/1992 | Currie ........................ 361/702 |
| 5,168,425 A | | 12/1992 | Radack |
| 5,204,804 A | | 4/1993 | Bailey et al. |
| 5,251,099 A | * | 10/1993 | Goss et al. .................. 361/721 |
| 5,278,434 A | | 1/1994 | Niwayama |
| 5,455,739 A | * | 10/1995 | Barden ........................ 361/719 |
| 5,621,617 A | * | 4/1997 | Goss et al. .................. 361/721 |
| 5,963,426 A | * | 10/1999 | Hayden et al. ............. 361/704 |
| 6,081,427 A | | 6/2000 | Miller |
| 6,341,067 B1 | * | 1/2002 | Conder ........................ 361/719 |

* cited by examiner

Primary Examiner—Gerald Tolin
(74) Attorney, Agent, or Firm—Himanshu S. Amin; Alexander M. Gerasimow; William R. Walbrun

(57) ABSTRACT

A stack assembly comprising a housing into which an alternating sequence of elements such as heat sinks and printed circuit boards (PCBs) carrying press-packaged semiconductor devices may be mounted and placed under pressure by a clamping device for use in a variety of power system applications. The PCBs are mounted to the heat sinks by a bracket which axially aligns the press-packaged devices with a longitudinal axis defined by the clamping device. Heat sink compartments in the housing are sized slightly larger than the heat sinks to allow the heat sinks some horizontal play within the compartment when the clamping device is loosened. This is further achieved by using floating anchors to connect the heat sinks to the housing and a flexible connector to connect the heat sinks to a power source. The heat sinks may thus be easily shifted to remove a malfunctioning PCB whilst the bulk of the stack remains in the assembled state, thereby facilitating the rapid re-assembly of the stack.

19 Claims, 12 Drawing Sheets

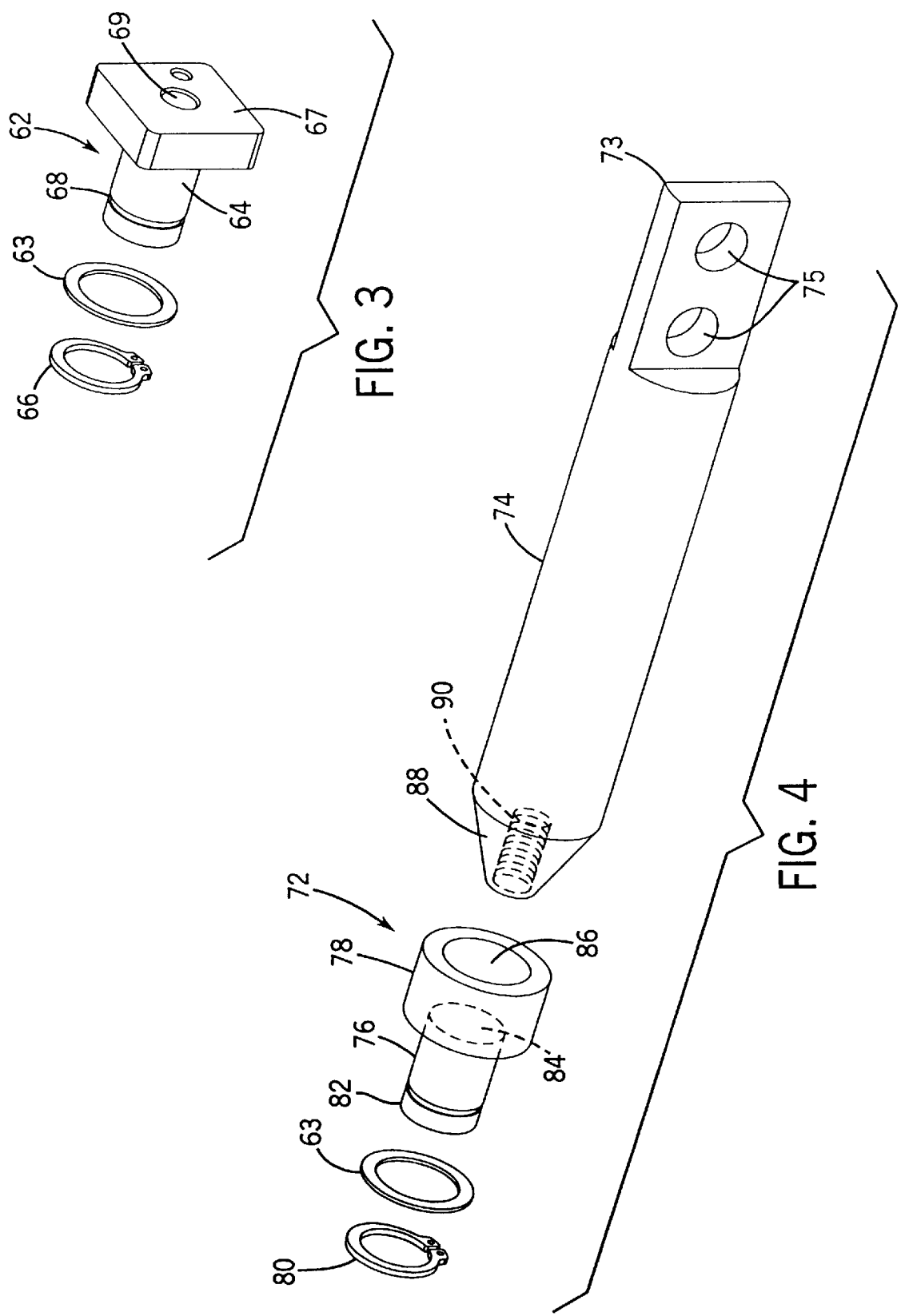

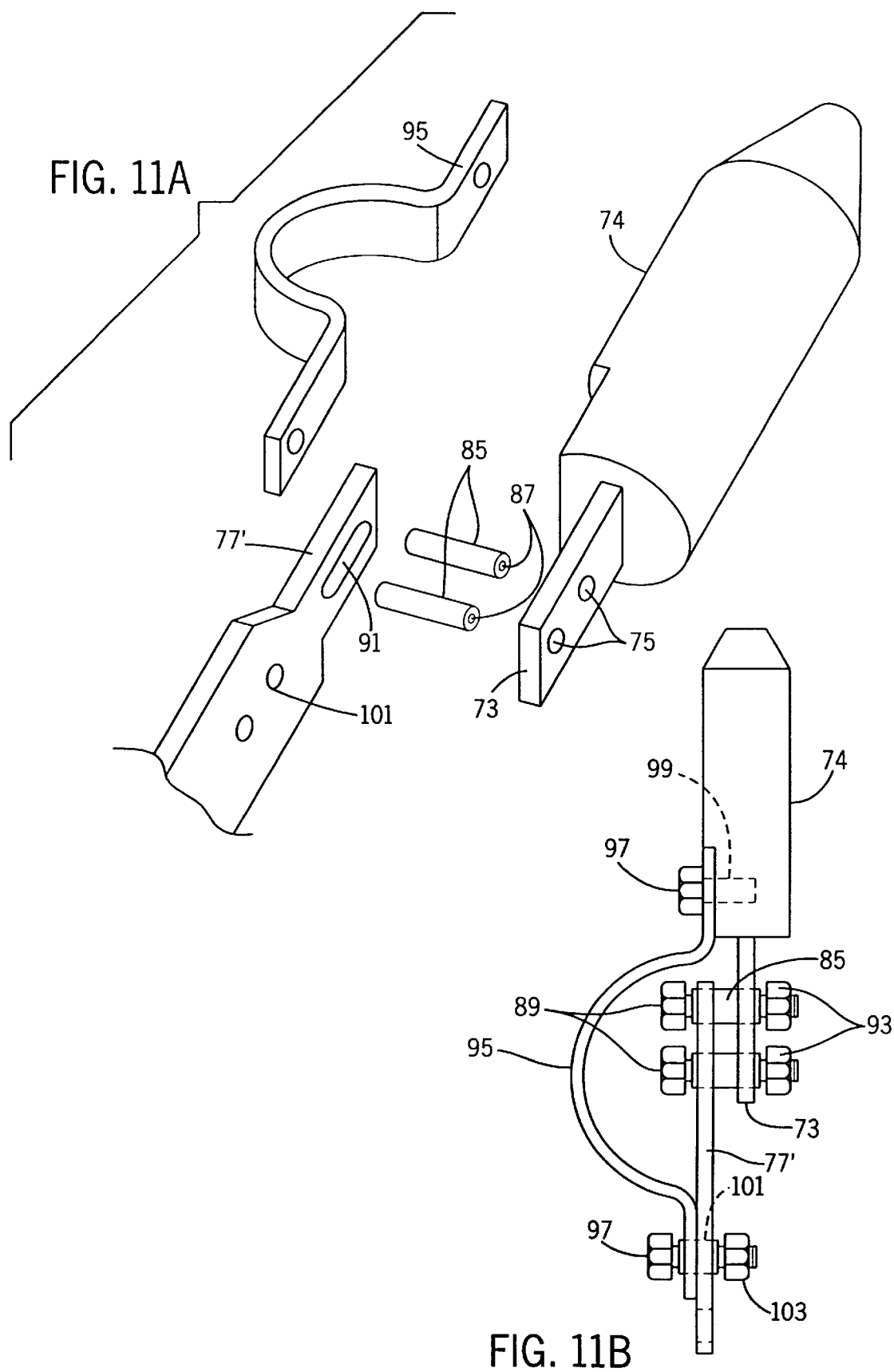

STACK ASSEMBLY HOUSING

FIELD OF INVENTION

The invention generally relates to a housing device for mounting an assembly of press-pack semiconductor devices and associated heat sinks, and to a stacked an assembly of assembly of such devices.

BACKGROUND OF INVENTION

Medium to high voltage semiconductor devices such as gate turnoff thyristors (GTOs), silicon controlled rectifiers (SCRs) and insulated gate bipolar transistors (IGBTs) are used in a variety of power system applications. For example, IGBTs may be used as the switching elements in a power inverter bridge controlling a 1200 horsepower motor. These mediums to high power semiconductor devices are characterized by current and voltage ratings of approximately 100 to 300 amps and 1.2 to 10 kV.

Due to the relatively high power capacities of such semiconductor devices they have to be packaged so as to contend with a number of issues, including heat dissipation, electrical contact characteristics and arcing. One common form of packaging used by the manufacturers of such devices is the "press pack". In this packaging structure the semiconductor material is enclosed in a typically cylindrically-shaped casing. The tubular body of the casing is constructed out of an electrically non-conductive material; ceramic is often used for its durability at high temperatures. The tubular body is capped with electrically conductive metallic plates which function as some (or all) of the terminals of the semiconductor device, such as the anode and cathode of a GTO or thyristor. These terminal end-faces present relatively broad planar surfaces for enabling good electrical and thermal contact with other power circuit components such as electrically conductive heat sinks. To further ensure good electrical contact and meet other operating requirements, press pack devices require a pre-specified amount of pressure to be applied thereto, typically in the range of 2–20 kN, although much higher forces are also possible.

The pressure or mounting force applied to the press-pack devices is provided by some sort of clamping mechanism. A typical clamping mechanism comprises two threaded rods fitted with plates for applying pressure provided by clamping nuts. Vice-like clamping mechanisms can also be used. These clamping mechanism are also often used to stack multiple numbers of press-pack devices and heat sinks together in abutting relationship. The resultant assembly, or "stack", can be used in a variety of power circuits such as the leg of an inverter and minimizes the number of clamping mechanisms required, which are extraneous elements of the power circuit.

In assembling the stack the conventional practice is to axially align all of the elements thereof in order to ensure uniform application of the mounting force. The way this was accomplished in the prior art is through the use of small guide pins inserted into locating holes formed on the abutting faces of the press-pack devices and heat sinks. Many press-pack devices are manufactured with small holes situated in the centre of the terminal end-faces thereof for this purpose. However, a significant problem arises with this system when it is necessary to replace one of the press-pack devices in the field. More specifically, the heat sinks of the stack are typically quasi-rigidly mounted to a supporting structure such as a housing or cabinet and therefore capable of moving apart only a few thousands of an inch to allow for thermal expansion. This distance is considerably less than the length of the guide pin as disposed in the locating hole. So, to replace one press-pack device in a large stack often meant the whole stack had to be removed from the cabinet, disassembled to replace the press-pack device, then re-assembled and re-installed. This task could require well over an hour. Alternatively, field personnel would attempt to bypass the disassembly procedure altogether by trying to pry out a press-pack device from the stack through the use of sheer force. This usually resulted in a significant scarring or gouging of the terminal end-faces of the press-pack device caused by dragging it over the embedded locating pins, and the gouges were often significant enough so as to render the press-pack devices inoperative because of a change in the thermal transfer characteristics.

A further limitation of conventional stack assemblies is that they do not readily accommodate the installation and removal of a press-pack semiconductor device which is mounted onto a printed circuit board.

SUMMARY OF INVENTION

The invention seeks to overcome various limitations of the prior art by providing a housing have compartments for mounting a predetermined arrangement of heat sinks and printed circuit boards ("PCBs") carrying press-pack semiconductor devices. The housing also includes a compartment for accommodating a force application member which provides the necessary mounting force required by the press-pack devices. The housing receives and distributes this force amongst the foregoing elements.

According to one aspect of the invention, a stack assembly is provided which includes the following components: one or more heat sinks, one or more PCBs, each having a press-packaged semiconductor device mounted therein, a plate having a force applying member, and a housing having compartments for accommodating the aforementioned component in a predetermined abutting arrangement. The compartments accommodating the heat sinks and PCBs are sized slightly larger than the heat sinks and the PCBs to allow each such component a predetermined amount of horizontal play in its corresponding compartment. Each PCB includes a bracket for mounting the PCB onto a corresponding heat sink. The mounting bracket and the size of the heat sink compartments are configured to substantially axially align the press-pack devices with a longitudinal axis defined by the force applying member.

In the preferred embodiment, the compartments for accommodating the heat sinks are provided with locating nubs for positioning the heat sinks. The width between locating nubs is slightly larger than the width of a corresponding heat sink, thereby providing the heat sink with a predetermined amount of horizontal play in its compartment.

In the preferred embodiment, the rear wall of each heat sink compartment is formed with at least one longitudinal receiving slot for receiving a heat sink anchor. The heat sink anchor features a body, which is fitted in the slot and has a breadth or width smaller than the length of the slot so as to be able to slide therein. Two flanges of the anchor respectively abut opposite sides of the rear wall so as to retain the anchor to the housing. The anchor also features a bore for enabling the heat sink to be fastened thereto. In this manner the anchor is floatingly mounted to the housing and does not interfere with the horizontal play afforded to the heat sink by the excess width between the locating nubs.

In the preferred embodiment, a flexible connector is used to connect a heat sink to a power source. The flexible connector includes a power lead and a bus bar. The power lead is connected at one end to a heat sink and at the other to the bus bar. The bus bar is rigidly connected to a terminal. To permit play in the heat sink in at least the horizontal direction, the bus bar is curved.

In an alternative embodiment, the flexible connector includes: a power bar with a transverse non-threaded bore, a bus bar with a slot, and at least one spacer with a longitudinal bore. The spacer is inserted through the non-threaded bore and through the slot in the bus bar. A bolt is passed through the bore in the spacer and secured with a nut. The spacer is longer than the combined thickness of the power lead and bus bar thereby permitting play in the power lead and heat sink connected thereto. A wire connected at one end to the power lead and at the other to the bus bar ensures good electrical contact between the power lead and bus bar.

In the preferred embodiment, a recess in the heat sink compartment furthest from the force applying member accommodates a reaction plate which bears against the housing and distributes the clamping force indirectly applied to it by the force applying member through the sequence of axially aligned stack elements.

In the preferred embodiment each heat sink compartment has a rear wall having an opening of approximately the same shape and area of the rear face of a heat sink. A gasket is installed between the heat sink and the rear wall to form an airtight seal there between.

The housing also features compartments for accommodating resistor networks. Each resistor network compartment is provided with registering slots for engaging the edges of horizontal locator plates that are used to hold a resistor network in place in the compartment.

In the preferred embodiment, one form of heat sink anchors provide a means to connect the stack assembly to a power supply lead. These anchors have a flange for abutting the housing and a shaft connected at one end to the flange. The shaft has a diameter sized smaller than the length of the longitudinal slot in the rear wall so as to slide therein. A clip fits into a circumferential groove of the shaft so as to permit the anchor to be floatingly mounted to the housing through the slot. The anchor also features a smooth longitudinal bore which mediates the passage of a bolt between a heat sink and a power lead having a threaded bore, thus tightly securing the heat sink to the power lead via this anchor.

BRIEF DESCRIPTION OF DRAWINGS

The foregoing and other aspects of the invention will become more apparent from the following description of specific embodiments thereof and the accompanying drawings illustrating these embodiments. In the drawings:

FIG. 3 is an exploded view of a first embodiment of an anchor used to secure a heat sink to the housing;

FIG. 4 is a perspective view of a second embodiment of an anchor used to secure a heat sink and a power lug to the housing;

FIG. 11A is an exploded perspective view of an alternative bus assembly;

FIG. 11B is an assembled top view of an alternative bus assembly;

DETAILED DESCRIPTION OF PREFERRED EMBODIMENTS

Figure 1A:
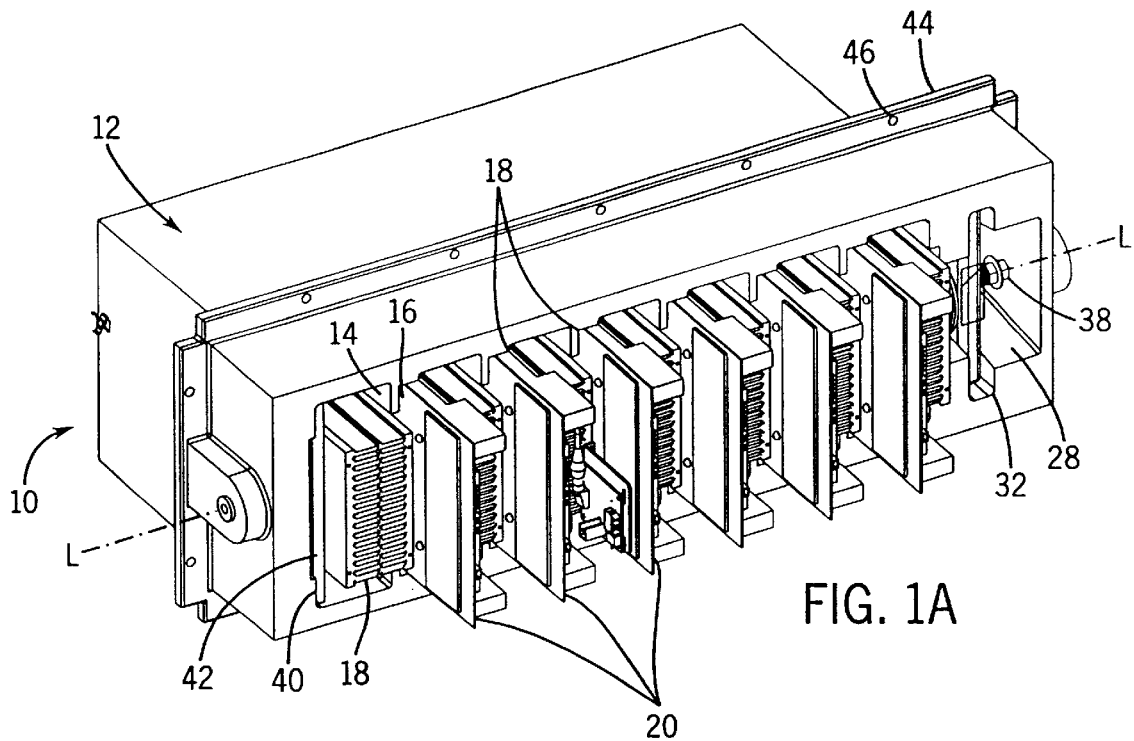
FIG. 1A is a front top left perspective view of a six unit stack assembly including a housing therefor.

Referring to FIGS. 1A, 1B, 2A and 2B a stack assembly 10 is shown which includes a housing 12. The housing 12 is preferably formed from moulded epoxy but may also be made from some other strong, electrically non-conductive material. The housing 12 features a plurality of compartments 14 and 16 that are designed to respectively accommodate heat sinks 18 and PCBs 20. Each PCB 20 has a press-pack semiconductor device 22 mounted thereon (as shown best in the exploded view of FIG. 1B). PCB 20 also features a bracket 24 for mounting the PCB 20 onto a corresponding heat sink 18, as described in greater detail below. Within each heat sink compartment 14 a set of locating nubs 26 (as seen best in FIGS. 2A and 2B) are provided for positioning one of the heat sinks 18 therein. The width W between locating nubs 26 (within a compartment) is slightly larger than the width of a corresponding heat sink 18 in order to allow a predetermined amount of horizontal play while the heat sink is installed in its compartment 14. Note that the housing 12 may be configured to hold a different number of heat sinks, as required.

The housing 12 additionally includes a compartment 28 for accommodating a clamping mechanism. In the illustrated embodiment the clamping mechanism comprises a plate 32 which has a force-applying member 34 depending therefrom via a threaded shaft 36. The mounting force provided by the clamping mechanism is maintained by a preset washer spring 37 which is set by adjusting a tensioning nut 38. A recess 40 in the heat sink compartment 14 furthest from the clamping plate 32 accommodates a reaction plate 42. The force-applying member 34 and its associated shaft 36 define a longitudinal axis L of the stack assembly 10.

The horizontal play afforded to the heat sinks occurs in the direction of this axis L. A flange 44 having holes 46 traverses a perimeter of the housing 12 in a plane parallel to a rear wall 50 (as seen best in FIGS. 2A and 2B) of the heat sink compartments 14. The flange 44 and holes 46 may be used to install the stack assembly 10 to a cabinet wall or other support structure (not shown).

Figure 1B:
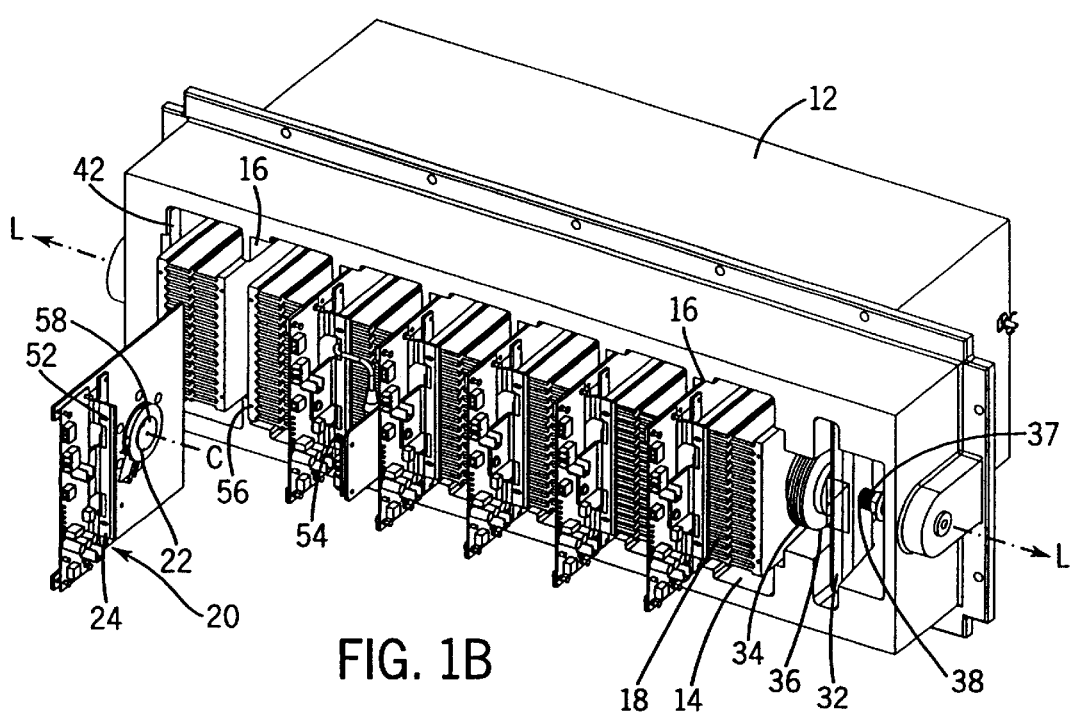
FIG. 1B is a front top right and partially exploded perspective view of the stack assembly of FIG. 1A showing a PCB in isolation.

Referring specifically to FIG. 1B, the stack assembly 10 is illustrated in a partially exploded view in which one PCB 20 is shown in isolation. As noted above, PCB 20 features mounting bracket 24 for mounting the PCB 20 directly onto one of the heat sinks 18. Each mounting bracket 24 is provided with one or more holes 52 through which screws 54 pass in order to seat into screw holes 56 located in an exterior surface of the corresponding heat sink 18. The mounting bracket 24, in conjunction with the depth of the corresponding heat sink compartment 14, is configured to substantially axially align the centre C of the conductive faces 58 of a press pack device 22 with the longitudinal axis L of the stack assembly 10. The press pack devices 22 and heat sinks 18 are thus arranged in abutting, axially aligned relationship such that current may flow through the heat sinks and into the press-pack semiconductor device, and heat may flow from the press pack devices 22 to the heat sinks 18.

When all of the elements of the stack are inserted into their respective compartments in the housing 12, the tensioning nut 38 may be tightened. This causes the force applying member 34 of the clamping mechanism to press against the adjacent first heat sink 18, and hence to apply a mounting force to the other elements of the stack assembly 10. The plates 32 and 42 of the clamping mechanism bear against the housing 12 which functions to distribute the clamping or mounting force amongst the elements of the stack. The housing 12 thus eliminates the need for the clamping rods of a prior art stack assembly.

To remove a PCB 20 from the stack assembly 10, it is only necessary to loosen the tensioning nut 38 and loosen the screws 54 affixing the selected PCB 20 to its corresponding heat sink 18. Given the horizontal play provided to the heat sinks 18 in their compartments 14, it then becomes a simple matter to remove the selected PCB 20 whilst the bulk of the stack assembly remains in an assembled and axially aligned state. The removal of the PCB 20, for example for servicing, and the subsequent reassembly of the stack will thus only take a few minutes to accomplish.

Figure 5:
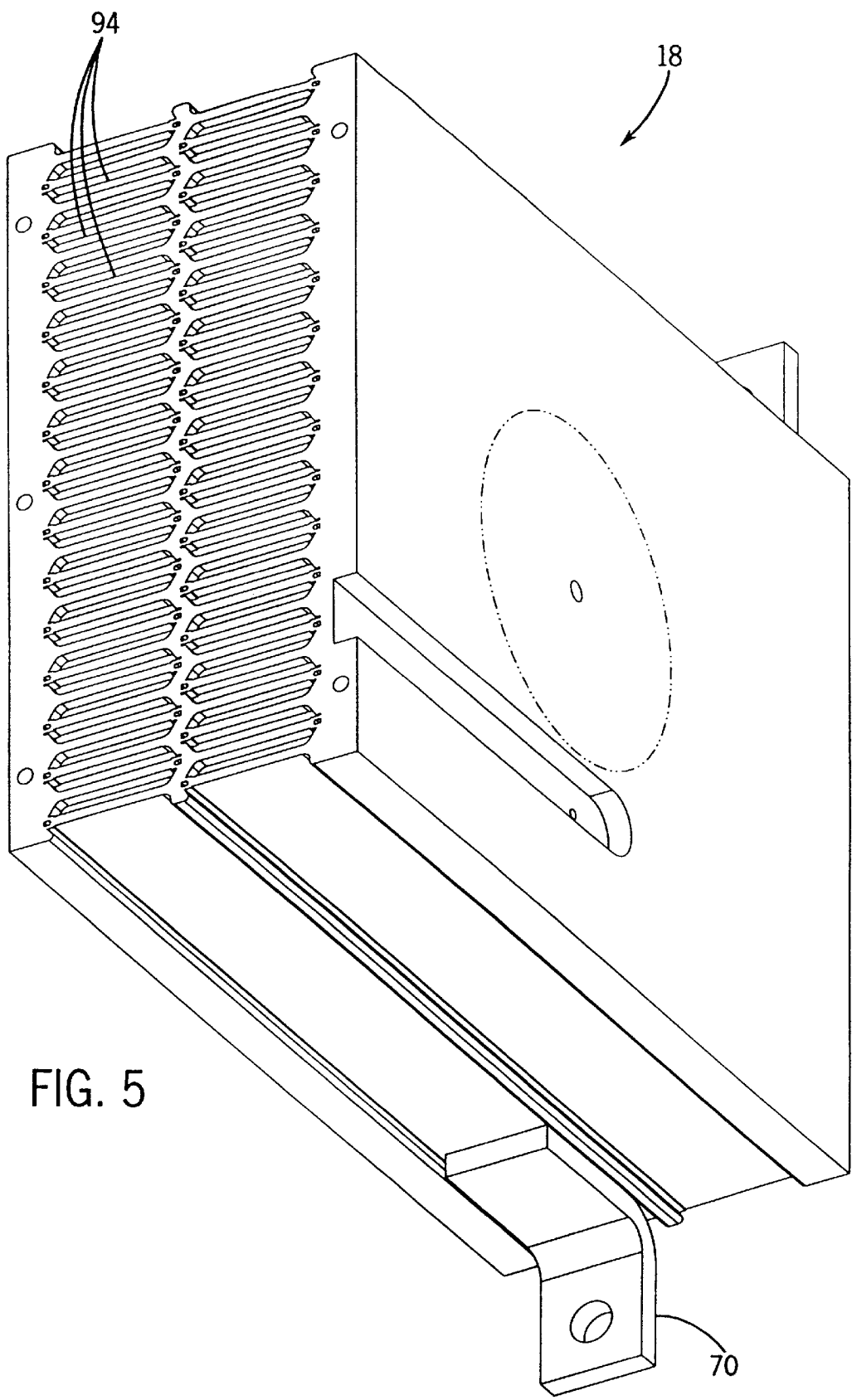
FIG. 5 is an isolated perspective view of a heat sink.
Figure 6:
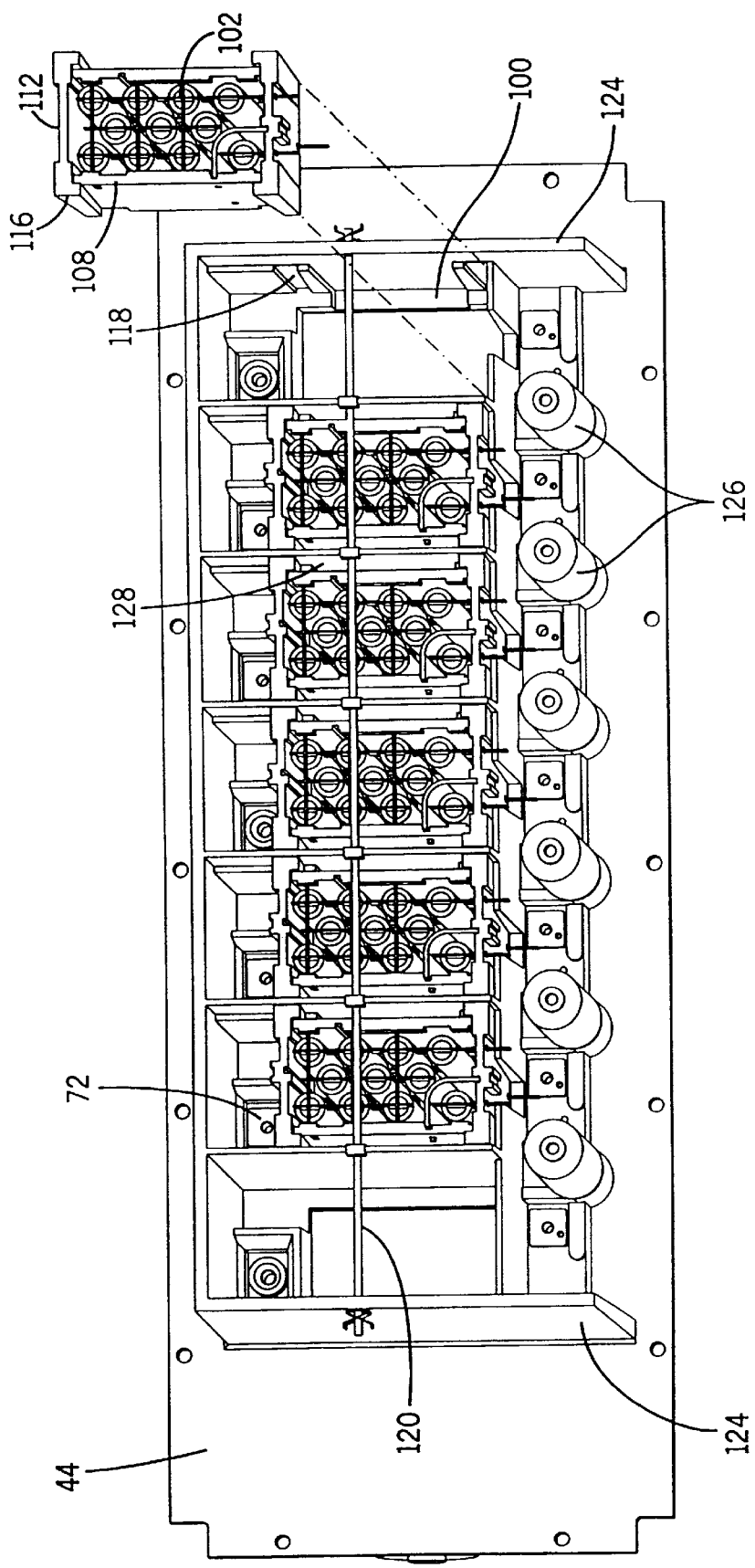
FIG. 6 is a rear left bottom and partially exploded perspective view of the stack assembly of FIGS. 1A and 1B and showing a power resistor network in isolation.
Figure 7A:
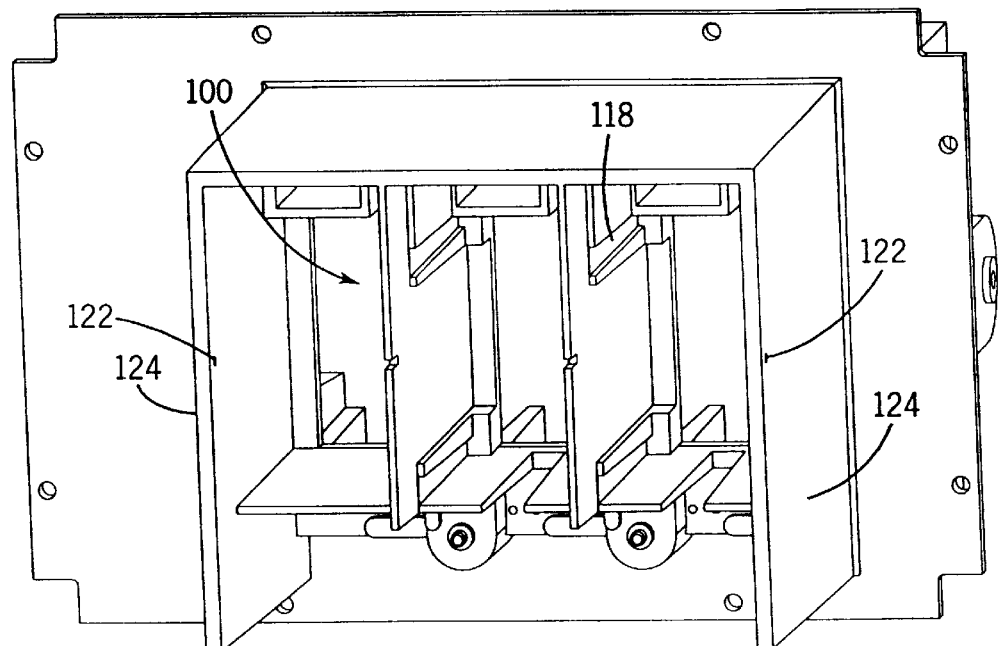
FIG. 7A is a rear right top perspective view of the housing shown in FIGS. 2A and 2B.
Figure 7B:
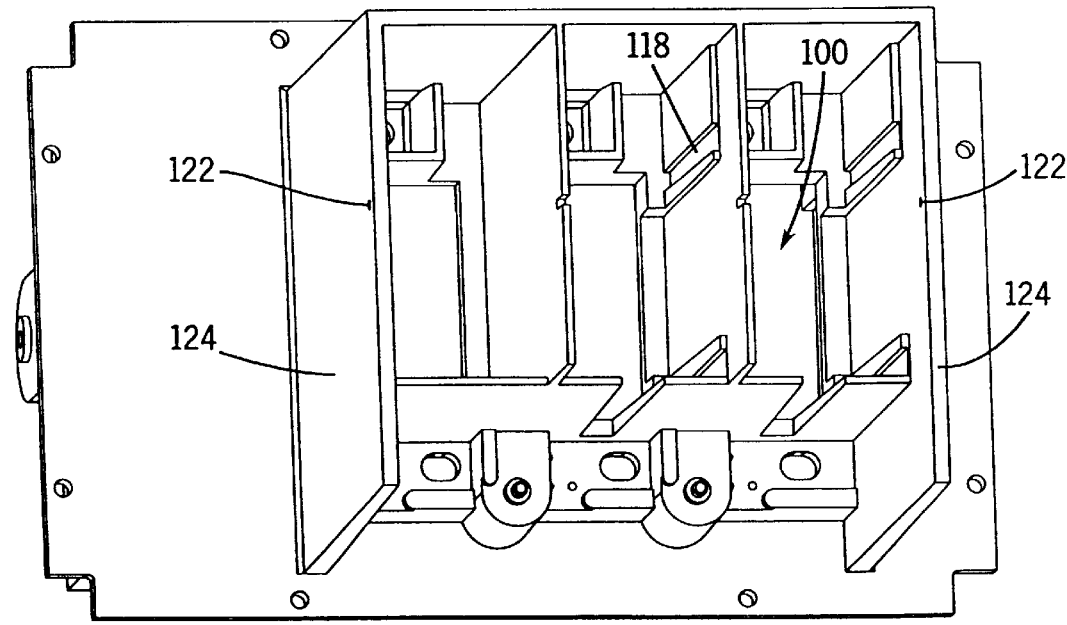
FIG. 7B is a rear left bottom perspective view of the housing shown in FIGS. 2A and 2B.
Figure 8:
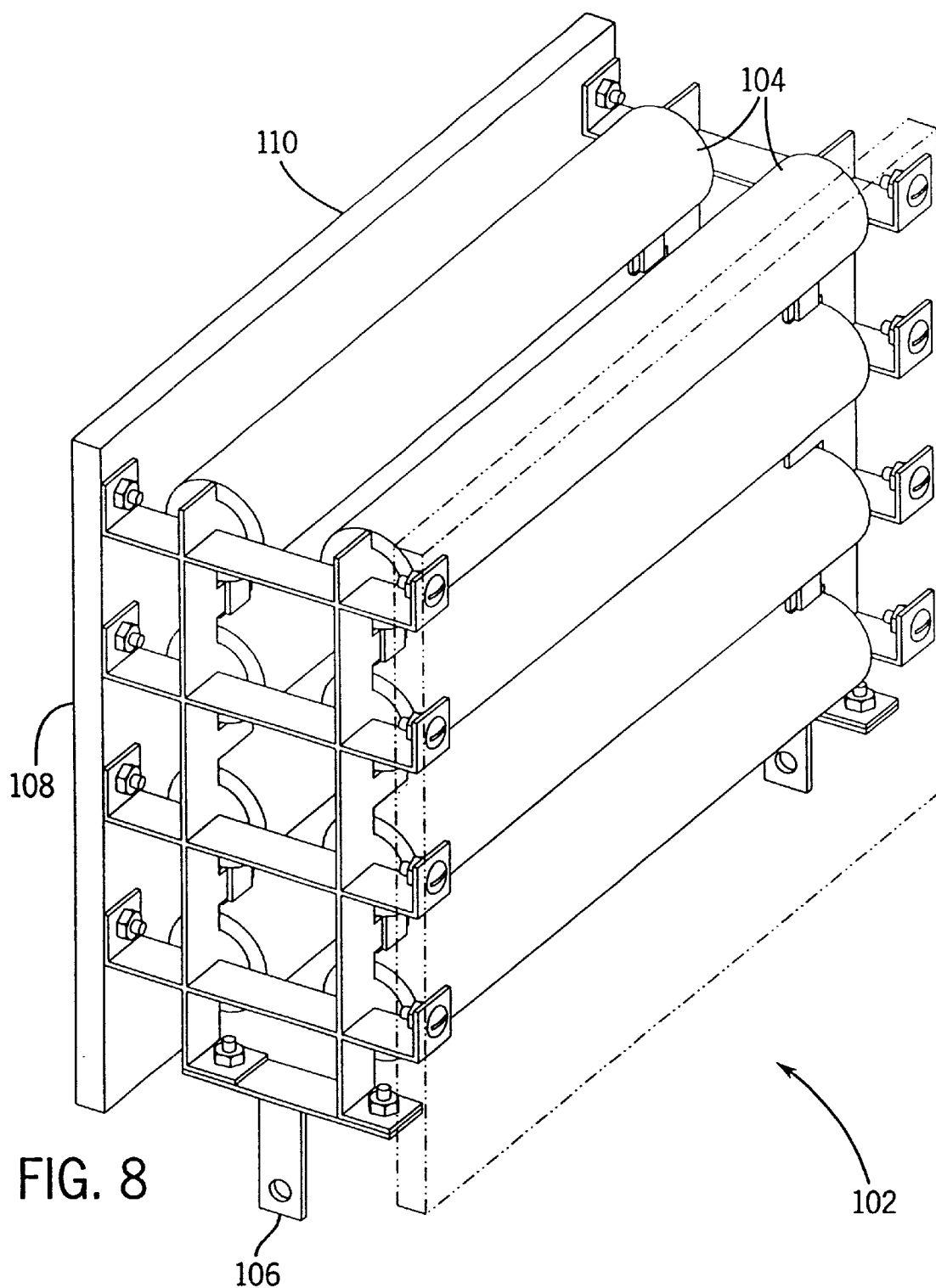
FIG. 8 is an isolated perspective view of a power resistor network.

Referring additionally to FIGS. 3, 4 and 5, a means for floatingly mounting the heat sinks 18 to the housing unit 12 is shown and described. As shown best in FIGS. 2A and 2B longitudinal slots 60 are molded or cut into a rear wall 50 of each heat sink compartment 18. Anchors 62 (FIG. 3) and 72 (FIG. 4) are slidingly fitted into these slots. More particularly anchor 62 (FIG. 3) is used exclusively to mount heat sink 18. This anchor features a cylindrical portion 64 having a diameter smaller than the longitudinal dimension of slot 60. The cylindrical portion 64 is fitted within the slot 60 and may slide therealong. A flange 67 which is sized larger than the slot abuts one side of the rear wall 50 of compartment 14. Once the anchor 62 is inserted into slot 60, a washer 63 is placed over the distal end of the anchor 62 and a clip 66 is fitted into a circumferential grove 68 of the anchor 62. The washer 63 is held in place by the clip 66 and abuts the opposite side of the rear wall 50 so as to retain the anchor 62 to the rear wall 50 of the housing unit 12. The distance between the flange 67 and the washer 63 is slightly greater than the thickness of the rear wall 50. The cylindrical portion 64 of the anchor 62 features a threaded bore 69. The heat sink 18 features apertured wings or ears 70 (FIG. 5) so that the heat sink 18 can be fastened to the threaded bore 69 via a bolt (not shown). In this manner anchor 62 may be floatingly mounted to the housing unit 12 in such a way as to not interfere with the horizontal play permitted to the heat sink 18 when disposed in its compartment 14.

Figure 12:
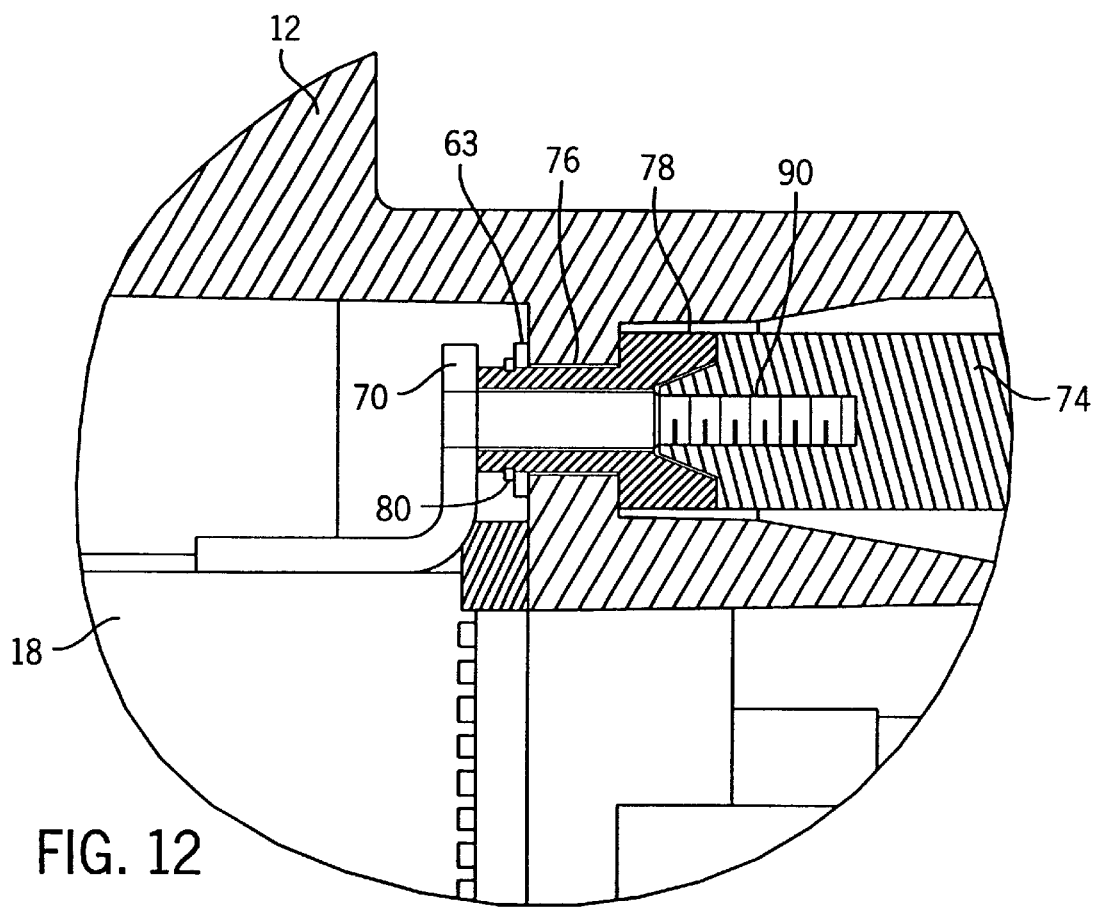
FIG. 12 is a cut out view of the second embodiment of an anchor used to secure a heat sink to the housing and to connect the heat sink to a power lead.
Figure 13:
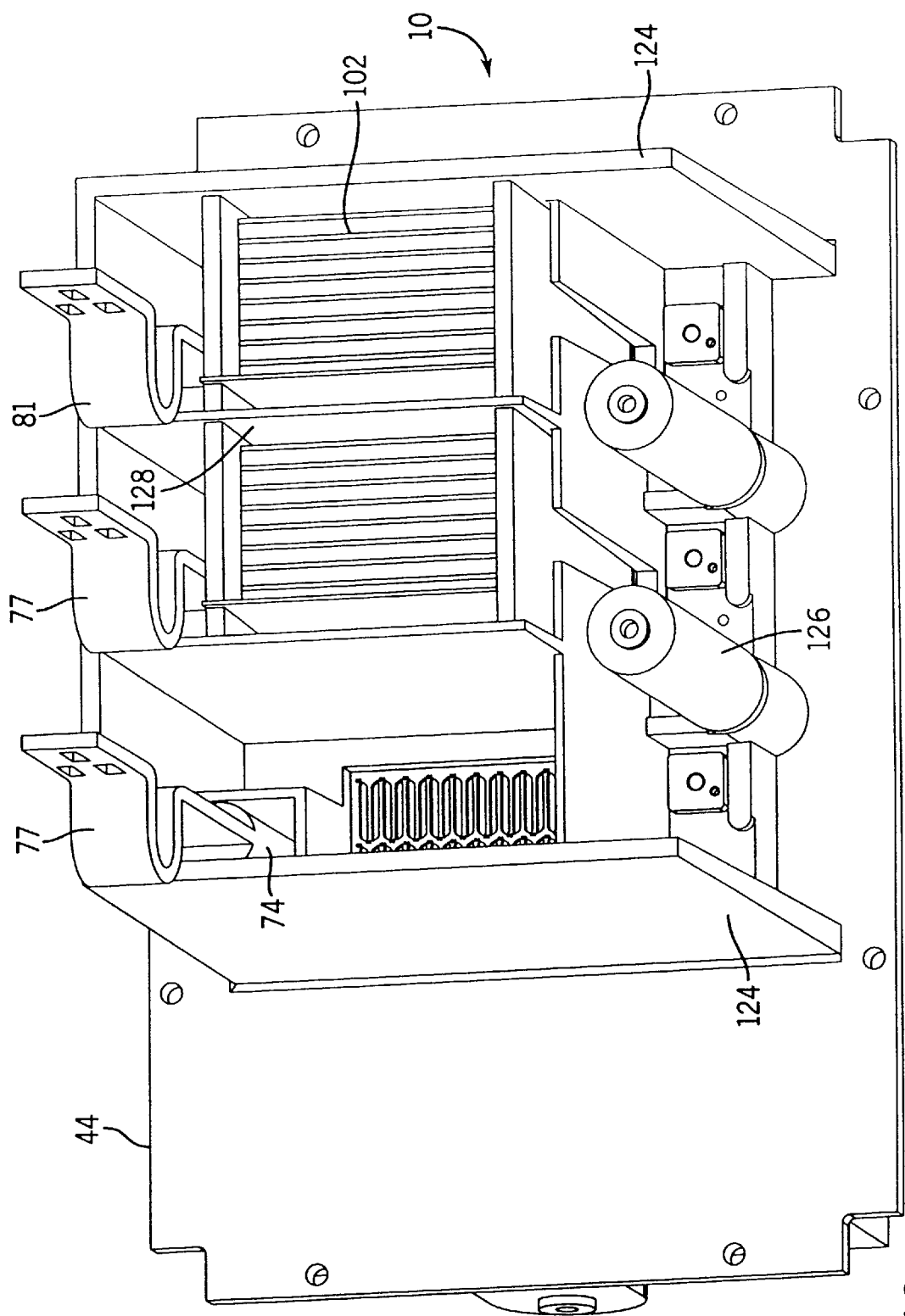
FIG. 13 is a rear left bottom perspective view of the stack assembly of FIGS. 1A and 1B showing power lugs and bus bars attached thereto.

Anchor 72 (FIG. 4) is used to fasten the heat sink 18 (which conducts electricity to and from the press-pack semiconductor device) to the housing 12 as well as to a power lead or lug 74. This is shown in FIGS. 12 and 13. As with anchor 62, anchor 72 (FIG. 4) features a cylindrical portion 76 having a diameter smaller than the longitudinal dimension of slot 60. The cylindrical portion 76 is fitted within slot 60 and may slide therealong. This anchor also features a flange 78 which is sized larger than slot 60 such that the flange will abut one side of the rear wall 50 of compartment 14 when the anchor 72 is inserted in slot 60. A washer 63 is fit over the cylindrical portion 76 and is held in place by a clip 80, which is fitted into a circumferential grove 82 of the anchor 72. The washer 63, held in place by the clip 80, will abut the other side of the rear wall 50 and thereby retain the anchor 72 to the housing 12. The distance between the flange 78 and the washer 63 is slightly greater than the thickness of the rear wall 50. Anchor 72, however, features a non-threaded bore 84 as well as a flared opening 86. The power lug 74 features a conical front end 88 which may be seated into the opening 86. The front end 88 of the lug features a threaded inner bore 90 (shown in phantom) to which one of the apertured ears 70 of heat sink 18 may be fastened via a bolt (not shown). In this manner the anchor 72 may be floatingly mounted to the housing 12 in such a way so as not to interfere with the horizontal play permitted between the heat sink 18 and the locating nubs 26 of its corresponding compartment 14. It will thus also be seen that anchor 72 features a means for simultaneously mounting a power lug to the housing 12.

Figure 10A:
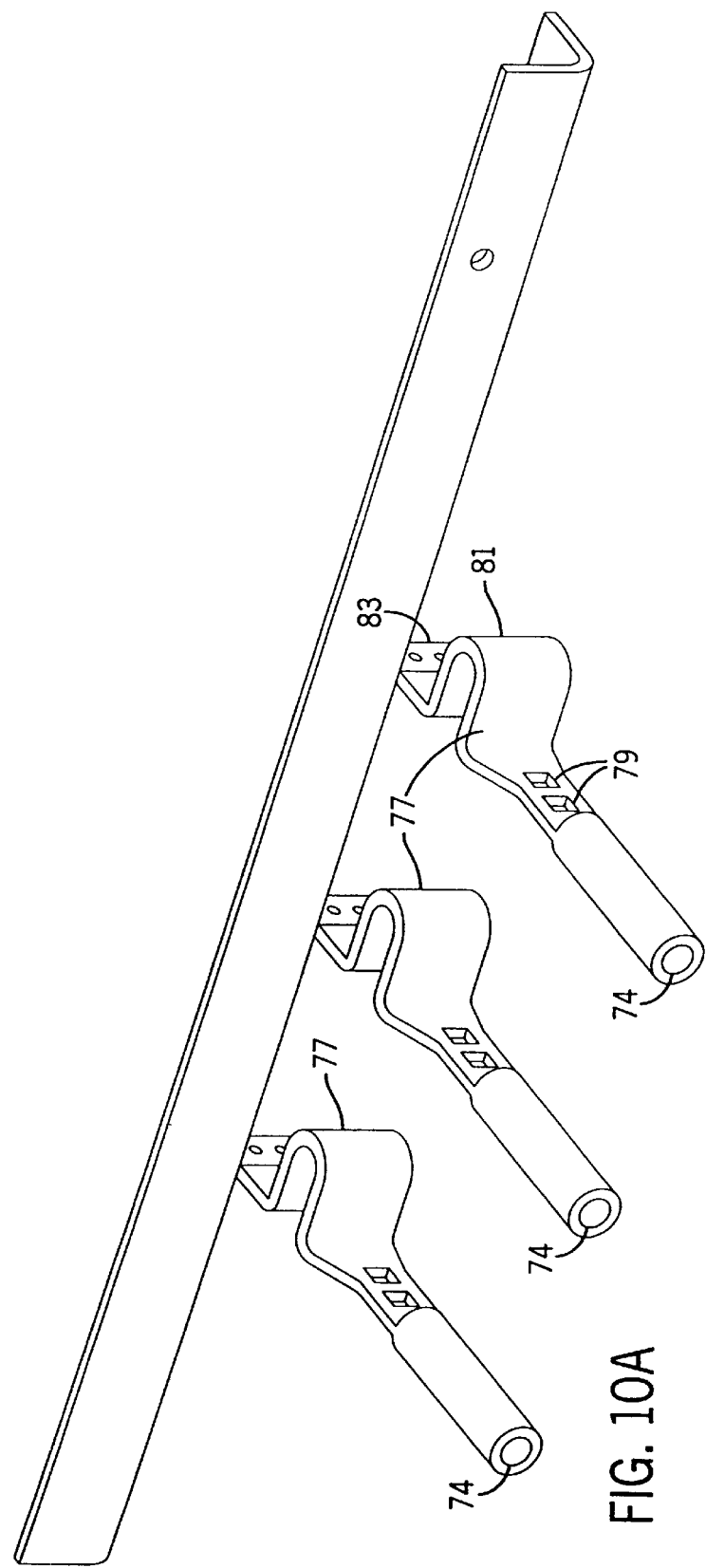
FIG. 10A is an isolated perspective view of the bus assembly.
Figure 10B:
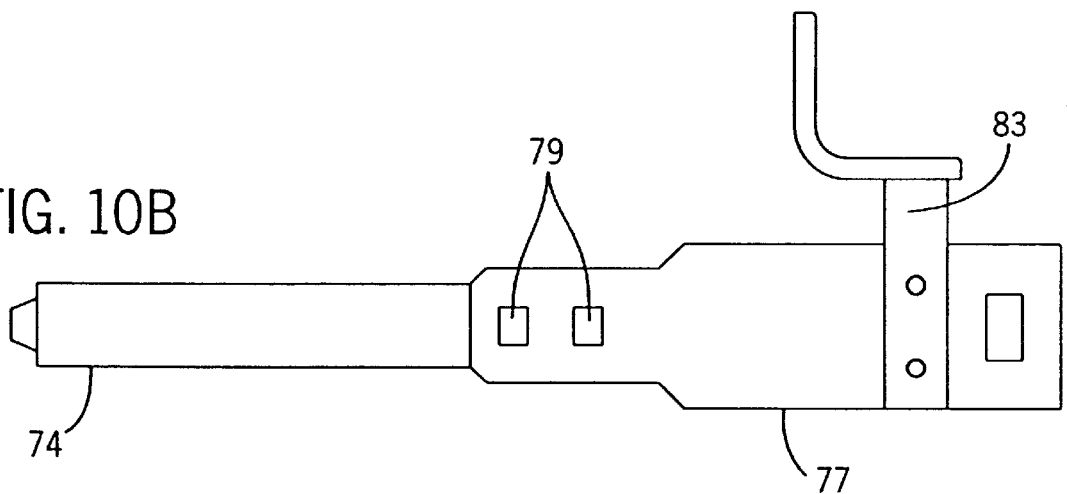
FIG. 10B is an isolated side view of the bus assembly.

Referring additionally to FIGS. 10A and 10B the power lug 74 features a rectangular fin 73 (FIG. 4) at its rear end which is used to attach the power lug 74 to a bus bar 77. The bus bar 77 is rigidly connected at its opposite end to a terminal 83. The rectangular fin 73 is provided with two non-threaded bores 75 therethrough. The bus bar 77 is constructed of a flat generally rectangular piece of metal and is provided with two non-threaded bores 79 passing through the thickness of the bus bar 77. The bores 79 correspond in size and location to the bores 75 in the power lug 74. The power lug 74 is attached to the bus bar 77 via two bolts (not shown), each passing through corresponding bores 75 and 79, respectively. Each bolt is secured with a nut (not shown). The bus bar 77 features a U-shaped bend 81 in the same direction as the axis L. The U-shaped bend 81 provides the bus bar 77 with some flexibility, permitting the power lug 74, as well as the rigidly connected heat sink 18, some horizontal play. The bus bar 77 may alternatively be provided with some flexibility by constructing the bus bar 77 using three thin, flat, generally rectangular pieces of metal laminated to one another (not shown). This arrangement eliminates the need for a U-shaped bend 81.

In an alternative embodiment, horizontal play between the power lug 74 and the bus bar 77 is achieved using the arrangement shown in FIGS. 11A and 11B. The bores 75 through the rectangular fin 73 are at least the diameter of cylindrical spacers 85. A straight bus bar 77' features a longitudinal slot 91 that is at least as wide as the diameter of the cylindrical spacers 85. To connect the power lug 74 to the bus bar 77', the cylindrical spacers 85 are inserted through the bores 75 and through the slot 91. The cylindrical spacers 85 are provided with a smooth longitudinal bore 87 for receiving a bolt 89. The bolt 89 secures the bus bar 77' to the power lug 74 via the cylindrical spacers 85 and is secured with a nut 93. The cylindrical spacers 85 must be longer than the total thickness of the bus bar 77' and the rectangular fin 73 so that there is some horizontal play in the power lug 84 and the heat sink 18 connected thereto.

Good electrical contact between the power lug 74 and bus bar 77' is achieved by securing a wire 95, such as a braided wire, at one end to the bus bar 77' and at the other end to the power lug 74. The flexible connector may be secured to the bus bar 77' by a bolt 97 inserted through a non-threaded bore 101 and secured by a nut 103. The flexible connector 95 is secured to the power lug 74 using a bolt 97 screwed into a threaded bore 99 (shown in phantom) in the shaft of the power lug 74.

Figure 2A:
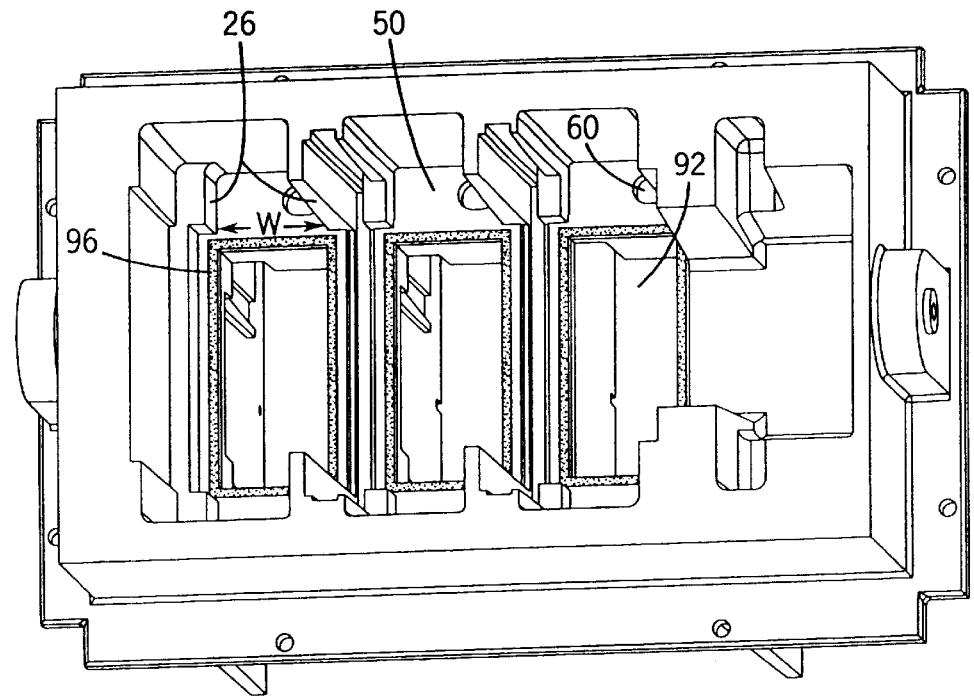
FIG. 2A is a front right bottom perspective view of a housing, taken in isolation, for a two unit stack assembly.
Figure 2B:
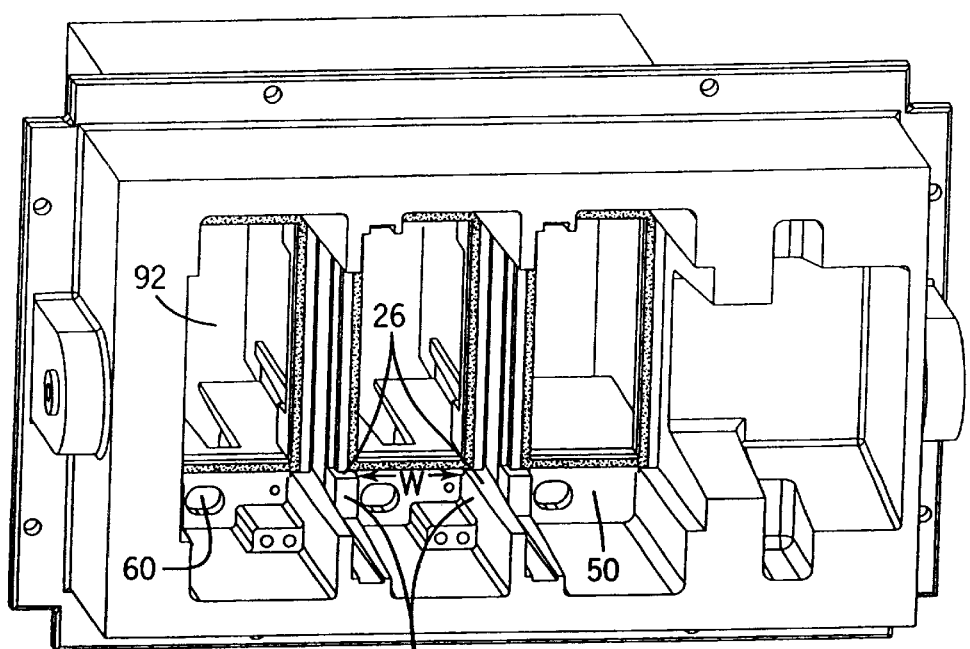
FIG. 2B is a front left top perspective view of the housing unit of FIG. 2A.

As shown in FIGS. 2A and 2B, each heat sink 18 is mounted over a rectangular opening 92 located in the rear wall 50 of heat sink compartment 14. The opening 92 is substantially the same shape and area of, but slightly smaller than, the rear face of heat sink 18. A cooling airflow may be drawn via a fan (not shown) through fissures 94 (FIG. 5) of the heat sinks 18. In order to ensure that the cooling air flow flows only through the heat sinks, gaskets 96 are disposed between the rear face of the heat sink and the rear wall 50 of the housing unit in order to provide a solid seal therebetween.

Figure 9:
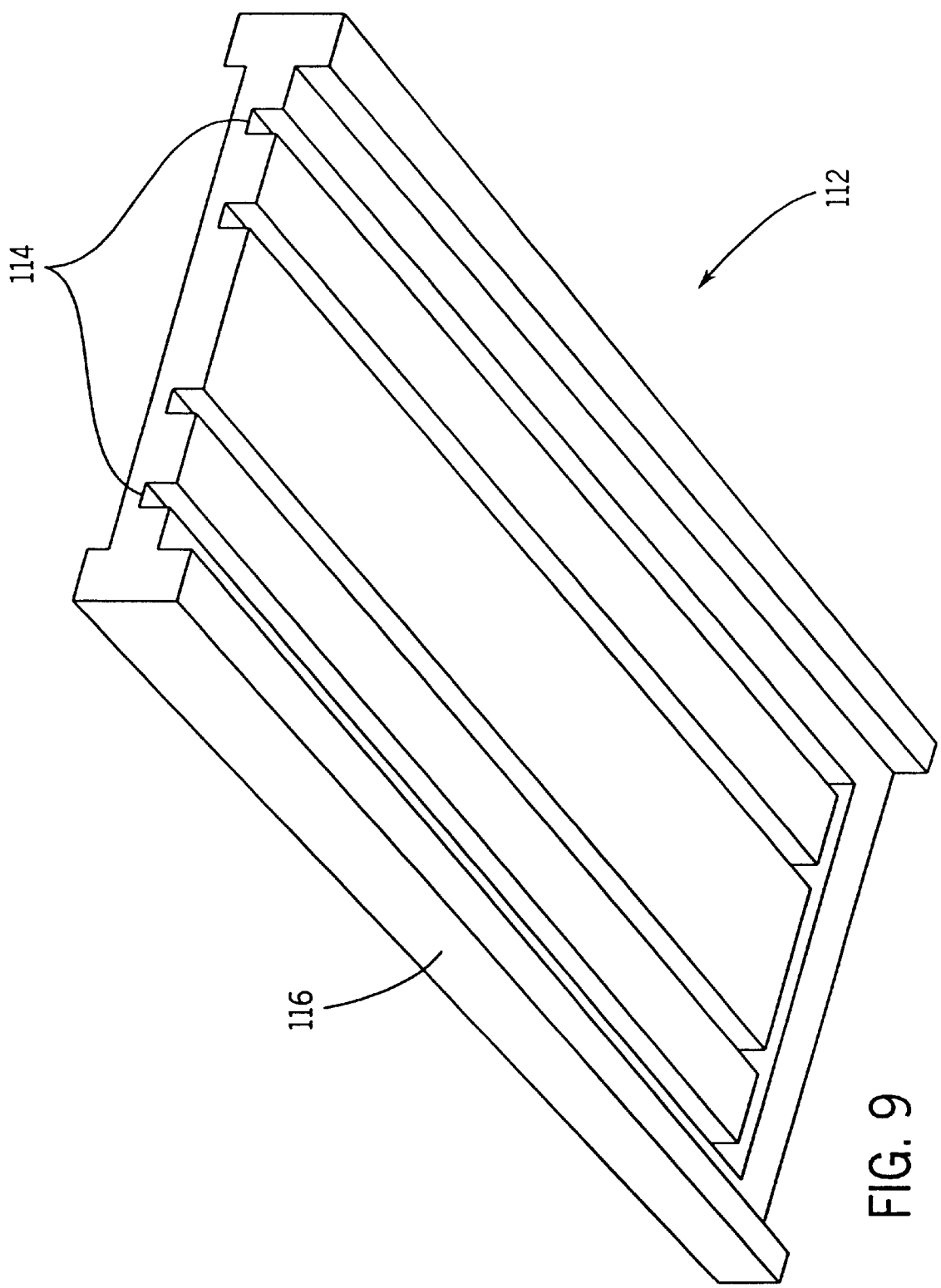
FIG. 9 is an isolated perspective view of a locator plate used to mount the resistor network to the housing.

Referring additionally to FIGS. 6, 7A, 7B, 8 and 9, an opposite side of the housing 12 has compartments 100 that are designed to accommodate a resister network 102. Each resister network 102 comprises a plurality of power resisters 104 (see best in FIG. 8) which are mounted on a frame 106 which in turn is mounted to support plates 108 (one of the support plates is shown in stippled lines in FIG. 8). The support plates 108 feature edges 110 for engaging grooves 114 of a locator plate 112 (FIG. 9). The locator plate 112 also features tapered edges 116 which are designed to engage registering slots 118 molded into the resistor network compartment 100 (see FIGS. 7a, 7b). When a resistor network 102 is installed into compartment 100 (FIG. 6), the locator plates 112, placed at both ends of the resistor network 102, guide the resistor network 102 into the compartment 100 via the registration slots 118. The resistor networks 102 are further retained by a retaining rod 120 that runs longitudinally along the centre line of the rear face of the housing 12 and passes through mounting holes 122 (see best in FIG. 7a) located in walls 124 of the housing 12.

Cooling air is drawn transversely through the stack assembly 10 by a fan (not shown). Cooling air first passes through the heat sinks 18, thus cooling the press-pack semiconductor devices 22. The air, now slightly warmer, then passes through the resister networks 102. This design optimizes the effect of the cooling air flow because the resisters can withstand higher temperatures than the semiconductor devices.

Capacitors 126 may also be attached to the rear of the housing unit 12 at regular intervals corresponding with the location of a dividing wall 128 associated with each compartment 100. In this manner the housing 12 can mount all of the typical elements, i.e., semiconductor devices, heat sinks, and resistors and capacitors for snubbing networks, associated with medium voltage power circuitry. Those skilled in the art will understand that numerous variations modifications may be made to the embodiment described herein without departing from the spirit and scope of the invention.

We claim:

1. A stack assembly, comprising:
   at least two heat sinks;
   at least two press-packaged semiconductor devices mounted onto a printed circuit board (PCB);
   a plate having a force applying member depending therefrom;
   a housing having compartments accommodating the at least two heat sinks, the PCB and the force applying member of the plate in a predetermined abutting arrangement, wherein the compartments are sized slightly larger than the at least two heat sinks and PCB to allow each such component a predetermined amount of horizontal play in its corresponding compartment, and
   wherein each PCB includes a bracket mounting the PCB onto one of the at least two heat sinks, the mounting bracket and said compartments being configured to substantially axially align the at least two press-packaged devices and the at least two heat sinks wit a longitudinal axis defined by said force applying member.

2. The stack assembly according to claim 1, further including means for floatingly mounting the heat sinks to the housing without affecting said horizontal play.

3. The stack assembly according to claim 2, further including a flexible connector for connecting the at least two heat sinks to a power source.

4. The stack assembly according to claim 3, wherein said flexible connector comprises a power lead and a bus bar, wherein said power lead is connected at one end to the at least two heat sinks and at the other end to a bus bar said bus bar being rigidly connected to a terminal.

5. The stack assembly according to claim 4, wherein said bus bar includes a curve therein to permit a limited amount of play in the at least two heat sinks in at least the horizontal direction.

6. The stack assembly according to claim 3, wherein said flexible connector comprises:
   a power lead with portions defining a transverse non-threaded bore therethrough;
   a bus bar with a surface defining a slot therethrough;
   at least one spacer with an inner surface defining a non-threaded bore for receiving a bolt, said spacer being longer than the combined thickness of the bus bar and power lead thus permitting play in the power lead in at least the horizontal direction when said power lead, bus bar and spacer are secured by inserting said spacer through the transverse non-threaded bore and slot, and inserting a bolt through the non-threaded bore in the spacer and securing said bolt with a nut; and
   a wire connected at one end to the bus bar and at the other to the power lead to ensure good electrical contact between the power lead and bus bar.

7. The stack assembly according to claim 1, wherein at least one compartment for accommodating one of the heat sinks has a rear wall with at least one longitudinal slot defined therein, and further including a heat sink anchor comprising a body fitted into the slot to slide therein and flanges to retain the body to the rear wall; said body having a bore for accepting a fastener for mounting the heat sinks.

8. The stack assembly according to claim 1, wherein at least one said heat sink compartment has a rear wall having a slot formed therein and wherein a heat sink anchor passes through the slot to secure one of the heat sinks yet does not affect said horizontal play.

9. The stack assembly according to claim 7, wherein each heat sink anchor comprises:
   a flange for abutting the housing;
   a shaft connected at one end to the flange, said shaft having a diameter sized smaller than a width of the slot;
   a clip for fitting into a circumferential groove on the shaft and thereby petting the anchor to be floatingly mounted to the housing; and a surface defining an inner bore for receiving a bolt used to secure one of the heat sinks to the anchor.

10. The stack assembly according to claim 1, wherein the heat sink compartments are provided with locating nubs for positioning the heat sinks, and the width between a set of locating nubs is slightly larger than the width of a corresponding heat sink.

11. The stack assembly according to claim 1, including a recess in the heat sink compartment furthest from the force applying member for accommodating a reaction plate which bears against the housing and distributes the clamping force indirectly applied to it by the force applying member.

12. The stack assembly according to claim 1, wherein the compartments for accommodating the heat sinks each have a rear wall formed with an opening of approximately the same shape and area of a fissured face of a heat sinks and wherein a gasket is placed between the corresponding heat sink and the rear wall in order to form an air-tight seal therebetween.

13. The stack assembly according to claim 1, wherein the housing includes compartments for accommodating resistor networks.

14. The stack assembly according to claim 12, wherein each compartment for accommodating a resistor network is provided with registering slot for engaging the edges of plates forming a portion of said resistor network.

15. The stack assembly according to claim 1, including means for connecting power leads to the heat sinks.

16. The stack assembly according to claim 14, wherein said power lead connecting means include an anchor comprising:

a flange for abutting the housing;

a shaft connected at one end to the flange, said shaft having a diameter sized smaller than the length of a slot defined in a wall of the housing;

a clip for fitting into a circumferential groove on the shaft which thereby permits the anchor to be floatingly mounted to the housing; and a surface defining an inner bore for mediating the passage of a bolt between a heat sink and a power lead having a threaded mounting bore.

17. The stack assembly according to claim 1, wherein the housing comprises means for mounting the stack assembly.

18. The stack assembly according to claim 17, wherein the means for mounting the stack assembly comprises a mounting flange.

19. The stack assembly according to claim 1, wherein a cooling air flow passes first through the heat sinks and then over at least one resister to thereby cool said heat sinks, the press-packaged semiconductor devices attached thereto, and the resisters.

* * * * *